US009325019B2

(12) United States Patent
Fujimoto et al.

(10) Patent No.: US 9,325,019 B2
(45) Date of Patent: Apr. 26, 2016

(54) COMPOSITE BODY, COLLECTOR MEMBER, FUEL BATTERY CELL DEVICE, AND FUEL BATTERY DEVICE

(71) Applicant: KYOCERA Corporation, Kyoto-shi, Kyoto (JP)

(72) Inventors: Tetsuro Fujimoto, Kirishima (JP); Masahiko Higashi, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 170 days.

(21) Appl. No.: 14/360,309

(22) PCT Filed: Nov. 26, 2012

(86) PCT No.: PCT/JP2012/080459
§ 371 (c)(1),
(2) Date: May 23, 2014

(87) PCT Pub. No.: WO2013/077445
PCT Pub. Date: May 30, 2013

(65) Prior Publication Data
US 2015/0086905 A1 Mar. 26, 2015

(30) Foreign Application Priority Data

Nov. 25, 2011 (JP) ................................. 2011-257838

(51) Int. Cl.
*H01M 8/02* (2006.01)
*C23C 14/08* (2006.01)
(Continued)

(52) U.S. Cl.
CPC ............ *H01M 8/0228* (2013.01); *C23C 14/08* (2013.01); *C23C 26/00* (2013.01); *C23C 28/322* (2013.01);
(Continued)

(58) Field of Classification Search
CPC . H01M 2/208; H01M 8/0219; H01M 8/0254; H01M 8/0232; H01M 8/0236
See application file for complete search history.

(56) References Cited

U.S. PATENT DOCUMENTS

2009/0035561 A1    2/2009  Gopalan et al.
2009/0297917 A1*  12/2009  Higashi et al. .................. 429/34
2010/0119886 A1*   5/2010  Nielsen et al. .................. 429/13
(Continued)

FOREIGN PATENT DOCUMENTS

CN    101300700 A    11/2008
JP    2008034202 A    2/2008
(Continued)

OTHER PUBLICATIONS

English abstract of JP 2008034202 A dated Feb. 14, 2008.
(Continued)

Primary Examiner — Jeremiah Smith

(57) ABSTRACT

A composite body in which the Cr diffusion can be sufficiently reduced and conductivity is good, a collector member, a fuel battery cell device, and a fuel battery device are provided. The composite body includes a substrate containing Cr, and a coating layer covering at least a part of the substrate, in which the coating layer includes a first layer containing Cr among constituent elements excluding oxygen, and including a chromium oxide crystal, a second layer disposed on the first layer, containing Zn, Al, and Cr among the constituent elements excluding oxygen, and including a spinel type crystal, a third layer disposed on the second layer, containing Zn and Mn among the constituent elements excluding oxygen, and including a spinel type crystal, and a fourth layer disposed on the third layer, containing Zn among the constituent elements excluding oxygen, and including a zinc oxide crystal.

6 Claims, 5 Drawing Sheets

(51) Int. Cl.
  *C23C 26/00* (2006.01)
  *C23C 28/00* (2006.01)
  *H01M 2/20* (2006.01)
  *H01M 8/12* (2006.01)

(52) U.S. Cl.
  CPC ........... *C23C 28/345* (2013.01); *C23C 28/3455* (2013.01); *H01M 8/0206* (2013.01); *H01M 8/0215* (2013.01); *H01M 8/0219* (2013.01); *H01M 8/0232* (2013.01); *H01M 8/0236* (2013.01); *H01M 8/0245* (2013.01); *H01M 2/208* (2013.01); *H01M 8/0247* (2013.01); *H01M 8/0254* (2013.01); *H01M 2008/1293* (2013.01); *Y02E 60/50* (2013.01); *Y02E 60/525* (2013.01)

(56) References Cited

U.S. PATENT DOCUMENTS

| | | | |
|---|---|---|---|
| 2011/0111327 A1* | 5/2011 | Ohmori et al. | 429/520 |
| 2012/0315564 A1* | 12/2012 | Fujimoto et al. | 429/452 |
| 2013/0288149 A1 | 10/2013 | Higashi et al. | |
| 2014/0272660 A1* | 9/2014 | Liu et al. | 429/452 |

FOREIGN PATENT DOCUMENTS

| | | |
|---|---|---|
| JP | 2010535290 A | 11/2010 |
| WO | 2011105578 A1 | 9/2011 |

OTHER PUBLICATIONS

International Search Report issued in the corresponding PCT application No. PCT/JP2012/080459, dated Jan. 22, 2013, 1 page.

* cited by examiner (A)

(B)

COMPOSITE BODY, COLLECTOR MEMBER, FUEL BATTERY CELL DEVICE, AND FUEL BATTERY DEVICE

TECHNICAL FIELD

The present invention relates to a composite body in which a coating layer is disposed on a substrate containing Cr, a collector member, a fuel battery cell device, and a fuel battery device.

BACKGROUND ART

As a next-generation energy source, various fuel battery devices generating power using hydrogen-containing gas and oxygen-containing gas have been proposed.

In general, such fuel battery devices are configured to house a fuel battery cell device, in which a plurality of fuel battery cells are combined, in a housing and generate power by supplying fuel gas (hydrogen-containing gas) to a fuel electrode layer of each fuel battery cell and supplying air (oxygen-containing gas) to an oxygen electrode layer. The plurality of fuel battery cells are electrically connected to each other in series with a felt-like or plate-like collector member.

Such a collector member is generally formed of a Cr-containing alloy having high workability and heat resistance.

However, when the collector member is formed of the Cr-containing alloy and is exposed to a high temperature atmosphere in the air or the like, diffusion of Cr (hereinafter, may also be referred to as "Cr diffusion") from the alloy to the fuel battery cells may occur at the time of operating the fuel battery cell device. Thus, in addition to a decrease in the performance of a fuel battery cell, there is a problem in that the heat resistance of the alloy decreases with a decrease in the amount of Cr contained in the alloy.

Therefore, in order to reduce such Cr diffusion, there has been proposed a composite body in which a second composite oxide layer having a spinel type crystal structure, a first largest content, a second largest content, and a third largest content of the second composite oxide layer being Zn, Cr, and Mn, a first composite oxide layer having a spinel type crystal structure, a first largest content and a second largest content of the first composite oxide layer being Zn and Al, and a zinc oxide layer or a third composite oxide layer having a spinel type crystal structure, a first largest content and a second largest content among constituent elements excluding oxygen of the third composite oxide layer being Zn and Mn are sequentially stacked on a surface of a substrate containing Cr (refer to PTL 1).

In PTL 1, the first composite oxide layer having a spinel type crystal structure, a first largest content and a second largest content of the first composite oxide layer being Zn and Al, may be directly disposed on the surface of the substrate containing Cr, and the third composite oxide layer may be disposed on the first composite oxide layer.

CITATION LIST

Patent Literature

PTL 1: International Publication No. 2011/105578

SUMMARY OF INVENTION

Technical Problem

However, in the invention disclosed in PTL 1, the first composite oxide layer containing Zn and Al and having a spinel type crystal structure is directly disposed on the surface of the substrate containing Cr, and the third composite oxide layer is disposed on the first composite oxide layer. However, the effect of reducing Cr diffusion is still small. Further, when the second composite oxide layer having a spinel type crystal structure, a first largest content, a second largest content, and a third largest content of the second composite oxide layer being Zn, Cr, and Mn, is formed between the substrate and the first composite oxide layer, the electrical resistance of the second composite oxide layer is large, and thus, there has been a problem in that the electrical resistance of the collector member itself is large.

An object of the present invention is to provide a composite body in which Cr diffusion can be sufficiently reduced and conductivity is good, a collector member, a fuel battery cell device, and a fuel battery device.

Solution to Problem

A composite body according to the present invention includes: a substrate containing Cr; and a coating layer covering at least a part of the substrate, in which the coating layer includes a first layer containing Cr among constituent elements excluding oxygen, and including a chromium oxide crystal, a second layer disposed on the first layer, containing Zn, Al, and Cr among the constituent elements excluding oxygen, and including a spinel type crystal, a third layer disposed on the second layer, containing Zn and Mn among the constituent elements excluding oxygen, and including a spinel type crystal, and a fourth layer disposed on the third layer, containing Zn among the constituent elements excluding oxygen, and including a zinc oxide crystal.

A collector member according to the present invention is a collector member to electrically connect a plurality of fuel battery cells to each other and includes the composite body.

A fuel battery cell device according to the present invention includes the collector member and a plurality of fuel battery cells, in which the collector member is arranged between the plurality of fuel battery cells and electrically connects neighboring fuel battery cells to each other.

A fuel battery device according to the present invention includes the fuel battery cell device and a housing in which the fuel battery cell is housed.

Advantageous Effects of Invention

According to the composite body of the present invention, it is possible to obtain the composite body in which the Cr diffusion from the substrate can be sufficiently reduced and conductivity is good. Therefore, the collector member for a fuel battery in which the Cr diffusion can be sufficiently reduced and conductivity is good can be obtained. Accordingly, the fuel battery cell device and the fuel battery device having good power generation performance can be obtained by electrically connecting the fuel battery cells using the collector member.

BRIEF DESCRIPTION OF DRAWINGS

FIG. 3(A) is a side view schematically illustrating the fuel battery cell device, and FIG. 3(B) is an enlarged cross-sectional view of a part surrounded with a dotted line in the fuel battery cell device in FIG. 3(A).

DESCRIPTION OF EMBODIMENTS

A collector member 20 which is one form of a composite body will be described below with reference to FIGS. 1 to 4.

Figure 1:
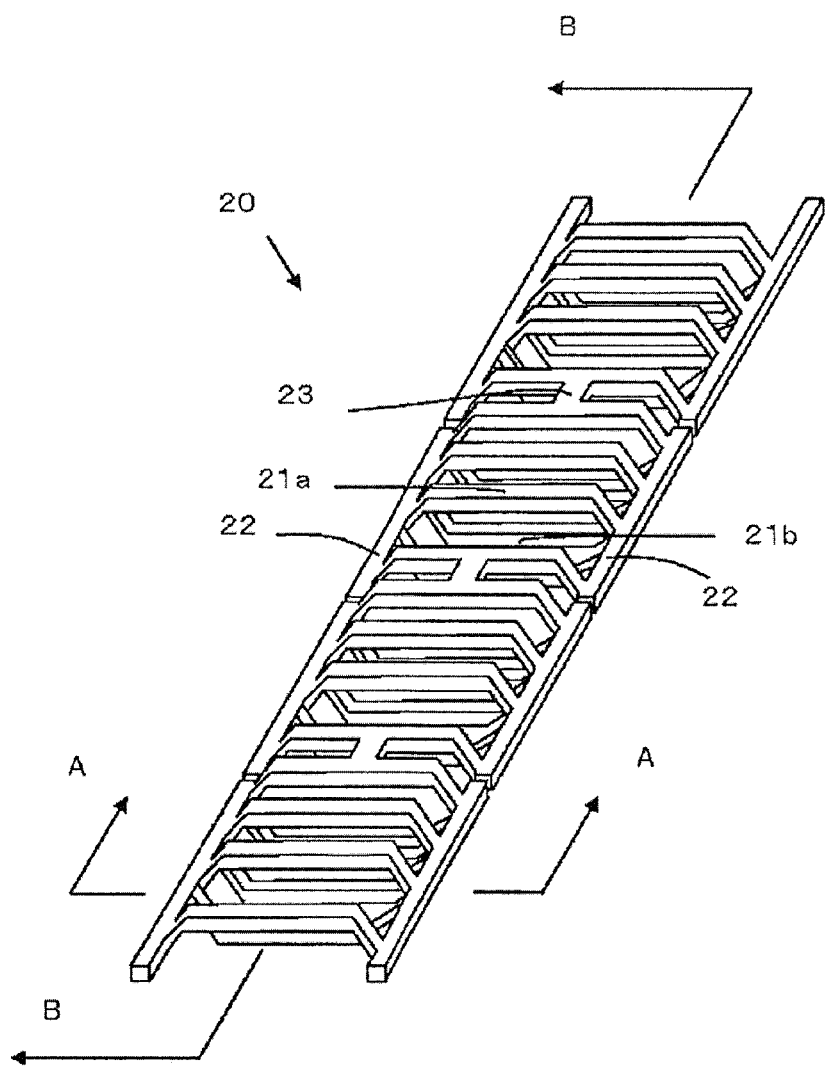
FIG. 1 is a perspective view illustrating an embodiment of a collector member formed of a composite body.

The collector member 20 illustrated in FIG. 1 is arranged between plural fuel battery cells 1 (not shown in FIGS. 1 and 2) and electrically connects neighboring fuel battery cells 1. The collector member 20 includes, as a basic structure of a current collecting portion, one junction portion 21a connected to one neighboring fuel battery cell 1, the other junction portion 21b connected to the other neighboring fuel battery cell 1, and connection portions 22 respectively connecting both ends of the pair of junction portions 21a and 21b.

More specifically, the plural strip-like junction portions 21a and 21b extending between the connection portions 22 laterally arranged are alternately curved in the front and rear of the connection portions 22 to form the current collecting portion. Plural current collecting portions are connected to each other with a conductive connection piece 23 and are continuously formed in a longitudinal direction L of the fuel battery cells 1, and form a single collector member 20.

Various fuel battery devices are known as such a fuel battery device and a solid oxide fuel battery device is known as a fuel battery device having a high power generation efficiency. The solid oxide fuel battery device can reduce the size of the fuel battery cell device per unit power and can perform a load following operation that follows a varying load required for a household fuel battery device.

Here, the solid oxide fuel battery device is configured to house a fuel battery cell device, in which plural solid oxide fuel battery cells are combined, in a housing as described later. The solid oxide fuel battery device generates power at a high temperature of 600° C. to 900° C. by supplying fuel gas (hydrogen-containing gas) to a fuel electrode layer of each fuel battery cell 1 and supplying air (oxygen-containing gas) to an oxygen electrode layer thereof. Therefore, each member such as the collector member 20, and a gas tank 34 that supplies fuel gas to the fuel battery cells 1 requires heat resistance and thus an alloy containing Cr is used as a substrate 200 forming each member.

Figure 2:
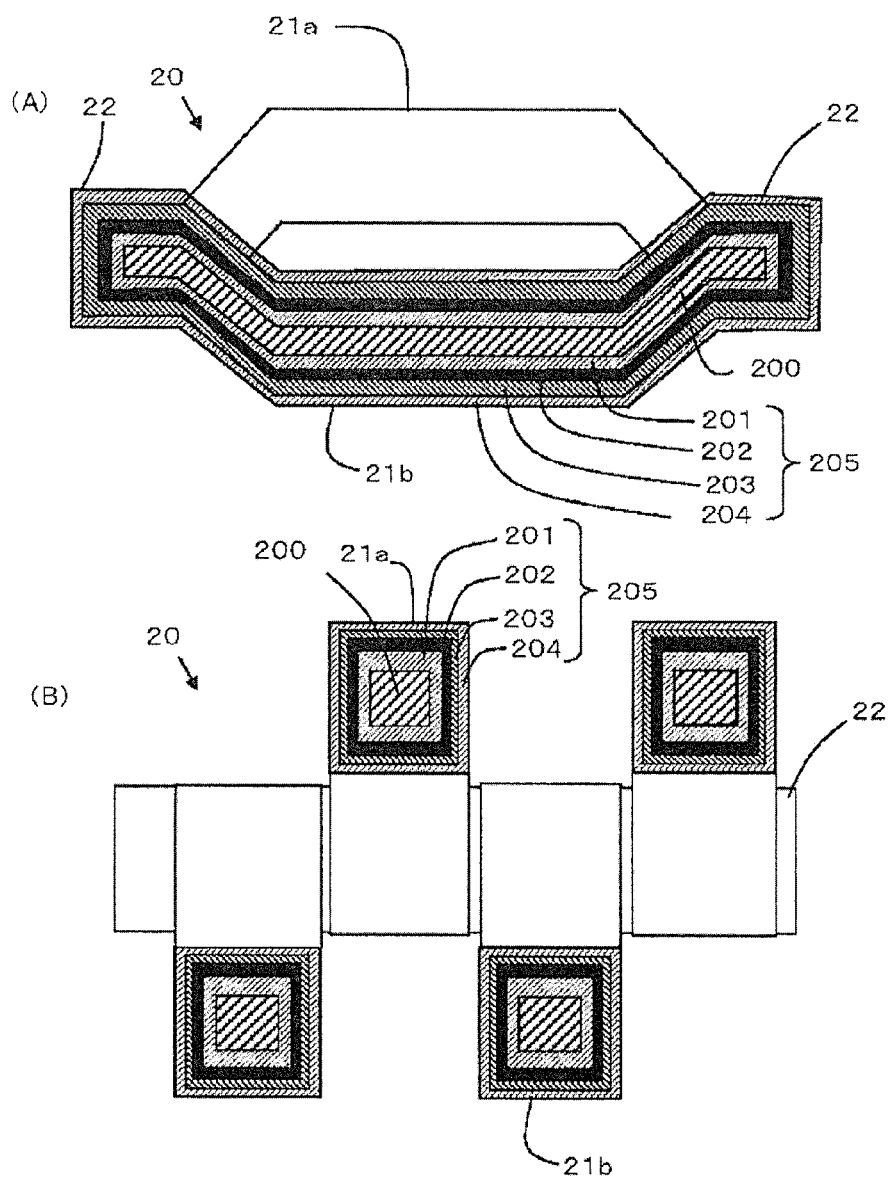
FIG. 2(A) is an enlarged cross-sectional view taken along the line A-A of the collector member illustrated in FIG. 1.
FIG. 2(B) is a partially-enlarged cross-sectional view taken along the line B-B of the collector member illustrated in FIG. 1.

Further, as illustrated in FIG. 2, in order to reduce the Cr diffusion from the substrate 200 containing Cr, a coating layer 205 is formed on the substrate 200. The coating layer 205 is configured such that a first layer 201 containing Cr among constituent elements excluding oxygen, and including a chromium oxide crystal, a second layer 202 disposed on the surface of the first layer 201, containing Zn, Al, and Cr among the constituent elements excluding oxygen, and including a spinel type crystal, a third layer 203 disposed on the surface of the second layer 202, containing Zn and Mn among the constituent elements excluding oxygen, and including a spinel type crystal, and a fourth layer 204 disposed on the surface of the third layer 203, containing Zn among the constituent elements excluding oxygen, and including a zinc oxide crystal are sequentially stacked on the substrate 200. In FIG. 2, to facilitate understanding, the thickness of the collector member 20 is thickened.

Next, each constituent member of the collector member 20 illustrated in FIG. 2 will be described in detail below.

Since conductivity and heat resistance are required, the substrate 200 is formed of an alloy containing two or more kinds of metal and 4 parts by mass to 30 parts by mass of Cr with respect to 100 parts by mass of the alloy is contained in the substrate 200. As the substrate 200 containing Cr, Ni—Cr-based alloy or Fe—Cr-based alloy can be used, and austenite-based stainless steel, ferrite-based stainless steel, or austenite-ferrite-based stainless steel can be used. The substrate 200 may further contain Mn and Al as elements other than Cr.

The first layer 201 is disposed on the surface of the substrate 200, contains Cr among the constituent elements excluding oxygen, and includes a chromium oxide crystal. That is, for example, the first layer 201 includes the chromium oxide crystal and a spinel type crystal that is a composite oxide of Cr and Mn, and at least one of Al and Mn may be solid-solved in the chromium oxide crystal. Since Cr is contained in the first layer 201, the thermal expansion coefficient of the first layer 201 can become closer to the thermal expansion coefficient of the substrate 200, and thus, joining strength with the substrate 200 can be improved.

As the spinel type crystal that is a composite oxide of Cr and Mn, $MnCr_2O_4$ is known. When the first layer includes the spinel type crystal that is a composite oxide containing Cr and Mn, a large number of the spinel type crystals are present in the first layer 201 toward the substrate 200 in many cases. The thickness of the first layer 201 is preferably 0.1 μm to 3 μm from the viewpoint of conductivity.

The second layer 202 is stacked to cover the surface of the first layer 201, contains Zn, Al, and Cr among the constituent elements excluding oxygen, and includes a spinel type crystal.

It is preferable that the elements of Zn, Al, and Cr contained in the second layer 202 be a first largest content, a second largest content, and a third largest content among the constituent elements excluding oxygen, and the order thereof is not particularly determined. There are two cases of a case where the second layer 202 is formed of only a Zn—Al—Cr-based spinel type crystal and a case where the second layer is formed of only a Zn—Al—Cr-based spinel type crystal and a Zn—Al-based spinel type crystal. In the case where the second layer 202 is formed of only a Zn—Al—Cr-based spinel type crystal, the second layer may not be formed of only a Zn—Al—Cr-based spinel type crystal and a Zn—Al-based spinel type crystal. Even in this case, it is possible to effectively reduce Cr diffusion from the substrate 200. The Zn—Al—Cr-based spinel type crystal is preferably contained at 50 mol % or more with respect to the total content of the second layer 202, and more preferably at 70 mol % or more. Whether or not the Zn—Al—Cr-based spinel type crystal is contained at 50 mol % or more with respect to the total content of the second layer 202 can be checked through the analysis of cation elements by energy dispersive X-ray analysis (STEM-EDS) of a TEM.

The Cr diffusion from the substrate 200 can be effectively reduced by the Zn—Al—Cr-based spinel type crystal. Thus, it is possible to obtain a composite body with improved long-term reliability.

Examples of the Zn—Al—Cr-based spinel type crystal include $Zn(Al_{1-x}Cr_x)_2O_4$ ($0 \leq X \leq 1$). Another element may be solid-solved in the Zn—Al—Cr-based spinel type crystal. Examples of another element solid-solved in the Zn—Al—

Cr-based spinel type crystal include Mn, Fe, and Co. By solid-solving at least one of Mn, Fe, and Co, it is possible to improve the conductivity of the Zn—Al—Cr-based spinel type crystal. The Zn—Al—Cr-based spinel type crystal in which the elements are solid-solved can be expressed by $Zn(Al,Cr,Mn)_2O_4$, $Zn(Al,Cr,Fe)_2O_4$, and $Zn(Al,Cr,Co)_2O_4$.

When another element is solid-solved in the Zn—Al—Cr-based spinel type crystal, the elements constituting the grains of the spinel type crystal can be identified in such a manner that an electron diffraction pattern of grains of the Zn—Al—Cr-based spinel type crystal is analyzed using a transmission type electron microscope (TEM) to identify a crystal phase and then, cation elements are analyzed by energy dispersive X-ray analysis (STEM-EDS) of the TEM.

The thickness of the second layer 202 is preferably 0.002 µm to 0.1 µm, particularly preferably 0.005 µm to 0.1 µm, and more preferably 0.01 µm to 0.05 µm, from the viewpoint of conductivity and reduction of the Cr diffusion.

It is preferable that a large amount of Cr in the second layer 202 be present in the second layer 202 toward the first layer 201 and not substantially present on the side opposite the first layer 201 (toward the third layer). In other words, the second layer 202 can be formed of a two-layer structure including a region containing Cr and a region substantially not containing Cr, but the boundary between the layers is not clear. When Cr is not detected by the STEM-EDS, it is determined that Cr is not substantially present.

Since the second layer 202 is formed on the surface of the first layer 201 and a layer including a Zn—Cr—Mn-based spinel type crystal with high electrical resistance is not disposed on the side closer to the substrate 200 than the second layer 202 as in the related art (electrical resistance increases by solid-solving Cr in a Zn—Mn-based spinel type crystal), the electrical resistance of the collector member 20 can be decreased and thus, current collecting performance can be improved. Further, the joining strength between the first layer 201 and the second layer 202 can be improved by forming the second layer 202 containing Cr on the surface of the first layer 201 containing Cr and cracking or peeling of the second layer 202 can be reduced, and thus, Cr diffusion can be reduced.

The third layer 203 is stacked to cover the second layer 202, contains Zn and Mn among the constituent elements excluding oxygen, and includes a spinel type crystal. It is preferable that Zn and Mn contained in the third layer 203 be a first largest content and a second largest content, and the order is not particularly determined. The spinel type crystal includes a spinel type composite oxide (hereinafter, may also be referred to as a Zn—Mn-based spinel). Examples of the Zn—Mn-based spinel include $ZnMn_2O_4$ and may include $Zn(Mn,Fe)_2O_4$ and $Zn(Mn, Co)_2O_4$ which contain elements such as Fe and Co. The third layer 203 is also a layer effectively reducing the Cr diffusion. In addition, it is possible to reduce the electrical resistance and to improve the conductivity of the third layer 203 by solid-solving Fe, Co or the like in the Zn—Mn-based spinel crystal.

The thickness of the third layer 203 is preferably 0.1 µm to 5 µm, and more preferably 0.1 µm to 3 µm, from the viewpoint of conductivity and reduction of the Cr diffusion.

As the Cr diffusion from the substrate 200, two cases of a case where Cr is vaporized and diffused to the outside as gas (hereinafter, may also be referred to as vapor-phase diffusion) and a case where Cr is diffused to the outside as solid (hereinafter, may also be referred to as solid-phase diffusion) can be considered. Therefore, in order to reduce the vapor-phase diffusion of Cr, it is preferable that the second layer 202 and the third layer 203 be disposed on the entire surface of the substrate 200. In order to reduce the solid-phase diffusion, it is preferable that the second layer 202 and the third layer 203 have high density.

In this manner, it is possible to more effectively reduce the Cr diffusion from the substrate 200 by stacking the second layer 202 and the third layer 203 in this order.

The fourth layer 204 is disposed to cover the surface of the third layer 203, contains Zn among the constituent elements excluding oxygen, and includes a zinc oxide crystal. The fourth layer 204 may include an oxide containing metal such as Mn, Fe, Co, and Ni. The content of the zinc oxide crystal in the fourth layer 204 is 70 mol % or more, and preferably 90 mol % or more with respect to the total content of the fourth layer.

Pure zinc oxide crystal is an insulating material, but $Zn_{1-\delta}O$ is a cation-permeable n-type semiconductor, and becomes an n-type impurity semiconductor by an impurity element having a high valence being added. Here, since Zn in ZnO is an ion of +2 valence, conductivity is given thereto by solid-solving a metal element becoming an ion of +3 valence or higher. Particularly, by solid-solving Fe or Al which has ions of +3 valence or higher, conductivity can be given thereto.

The thickness of the fourth layer 204 is preferably 0.1 µm to 5 µm, and more preferably 0.1 µm to 3 µm.

Whether or not the coating layer 205 includes the first layer 201, the second layer 202, the third layer 203, and the fourth layer 204 can be determined as follows. That is, the crystal structure thereof is specified by cutting the coating layer 205 constituting the collector member 20, analyzing the electron diffraction pattern of the cut section through the use of a transmission electron microscope (TEM) using a nano-beam diffraction method or a limited field-of-view electron diffraction method. The elements contained in the crystal structure can be checked through the use of the STEM-EDS and the compound can be identified on the basis of the amounts of the checked elements. What contents of constituent elements excluding oxygen are contained in the respective layers can be checked as the result using the STEM-EDS.

As for the collector member 20, a conductive adhesive layer (not shown) may be formed on the surface of the fourth layer 204 for bonding with a fuel battery cell. The conductive adhesive only has to have conductivity in a power generation atmosphere and a power generation temperature, and particularly, perovskite composite oxides containing La are preferably used as the conductive adhesive. Specifically, $LaFeO_3$-based or $LaMnO_3$-based perovskite oxides can be used. Perovskite composite oxides containing La, Co, and Fe are particularly preferable. The conductive adhesive may contain Mn and Zn, and the thickness is preferably 1 µm to 50 µm. The conductivity of the collector member is preferably 50 S/cm or more, more preferably 300 S/cm or more, and particularly preferably 440 S/cm or more.

Hereinafter, an example of the method for preparing the coating layer 205 will be described.

First, for example, $Cr_2O_3$ powder and a binder are mixed and fired at a temperature of 950° C. to 1150° C. for 0.5 hours to 5 hours to prepare a sputtering target for the first layer 201.

Next, for example, ZnO powder, $Cr_2O_3$ power, and $Al_2O_3$ powder are blended at a mole ratio of 2:1:1, and the blended powder and a binder are mixed and fired at a temperature of 950° C. to 1150° C. for 0.5 hours to 5 hours to prepare a Zn—Cr—Al-based spinel sintered body. Then, a sputtering target for forming a layer of the second layer 202 close to the substrate 200 is prepared. Further, for example, ZnO powder and $Al_2O_3$ powder are blended at a mole ratio of 1:1, and the blended powder and a binder are mixed and fired at a temperature of 950° C. to 1150° C. for 0.5 hours to 5 hours to prepare a Zn—Al-based spinel sintered body. Then, a sputtering target for forming a layer of the second layer 202 close to the third layer 203 is prepared.

Further, for example, ZnO powder and $Mn_2O_3$ powder are blended at a mole ratio of 1:1, and the blended powder and a binder are mixed and fired at a temperature of 950° C. to 1150° C. for 0.5 hours to 5 hours to prepare a Zn—Mn-based spinel sintered body. Then, a sputtering target for the third layer 203 is prepared.

In addition, for example, ZnO powder and a binder are mixed and fired at a temperature of 950° C. to 1150° C. for 0.5 hours to 5 hours to prepare a ZnO sintered body. Then, a sputtering target for the fourth layer is prepared.

The respective layers of the first layer 201, a layer of the second layer 202 close to the substrate 200, a layer of the second layer 202 close to the third layer, the third layer 204, and the fourth layer are sequentially prepared by sputtering on the substrate 200 to prepare the coating layer 205.

The shape of the collector member 20 is not limited to the shape illustrated in FIGS. 1 and 2. For example, a cylindrical shape, a mesh shape, or a shape obtained by processing a plate-like member in a comb shape and alternately curving the neighboring teeth to the opposite sides may be used.

The fuel battery cell device 30 will be described with reference to FIGS. 3 and 4.

Herein, in the fuel battery cell device 30, the above-described collector member 20 is arranged between the plural fuel battery cells 1 and electrically connects the neighboring fuel battery cells 1.

Figure 3:
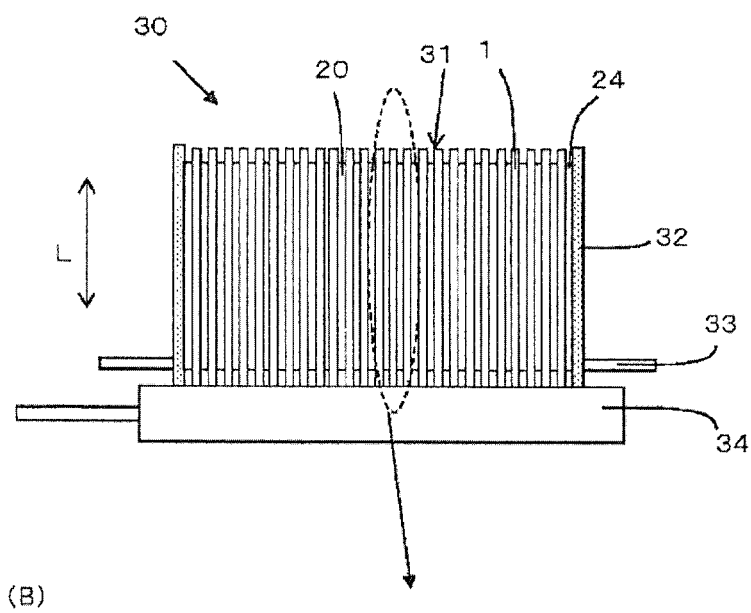
FIG. 3 is a diagram illustrating an embodiment of a fuel battery cell device.
Figure 3:
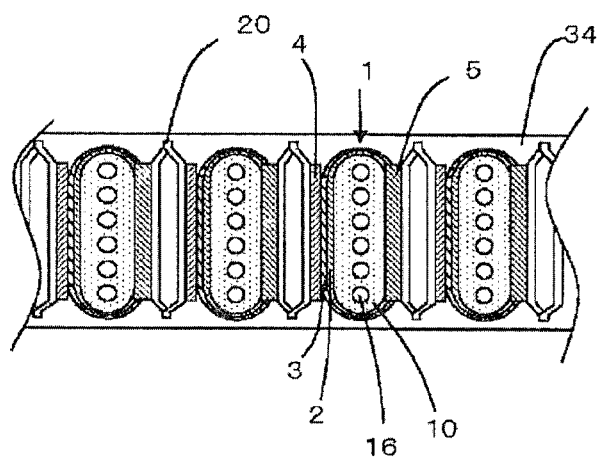

The fuel battery cell 1 includes a pillar-like conductive support 10 and the support 10 has a pair of parallel flat surfaces and includes gas flow channels 16 (six gas flow channels are arranged in the fuel battery cell 1 illustrated in FIG. 3) in which reactant gas (fuel gas) flows. A fuel electrode layer 2 as an inner electrode layer, a solid electrolyte layer 3, and an oxygen electrode layer 4 as an outer electrode layer are sequentially stacked on one flat surface of the support 10. An interconnector 5 is stacked on the other flat surface of the support 10. Plural pillar-like (hollow plate-like) fuel battery cells 1 are disposed upright, and the collector member 20 is arranged between the neighboring fuel battery cells 1 and electrically connects the fuel battery cells 1 in series to form a cell stack 31. The lower end of each fuel battery cell 1 is fixed to a gas tank 34 for supplying reactant gas (fuel gas) to the fuel battery cells 1.

The fuel battery cell device 30 includes conductive members 32 which interposes the cell stack 31 between both ends in the arrangement direction of the fuel battery cells 1 with end collector members 24 therebetween. The bottom ends of the conductive members 32 are fixed to the gas tank 34 and thus, the conductive members are elastically deformable. The bottom ends of the fuel battery cells 1 and the bottom ends of the conductive members 32 are fixed to the gas tank 34 with, for example, an adhesive material having good heat resistance (such as a glass sealing material). The gas flow channels 16 in the support 10 communicate with a fuel gas chamber (not shown) of the gas tank 34.

Figure 4:
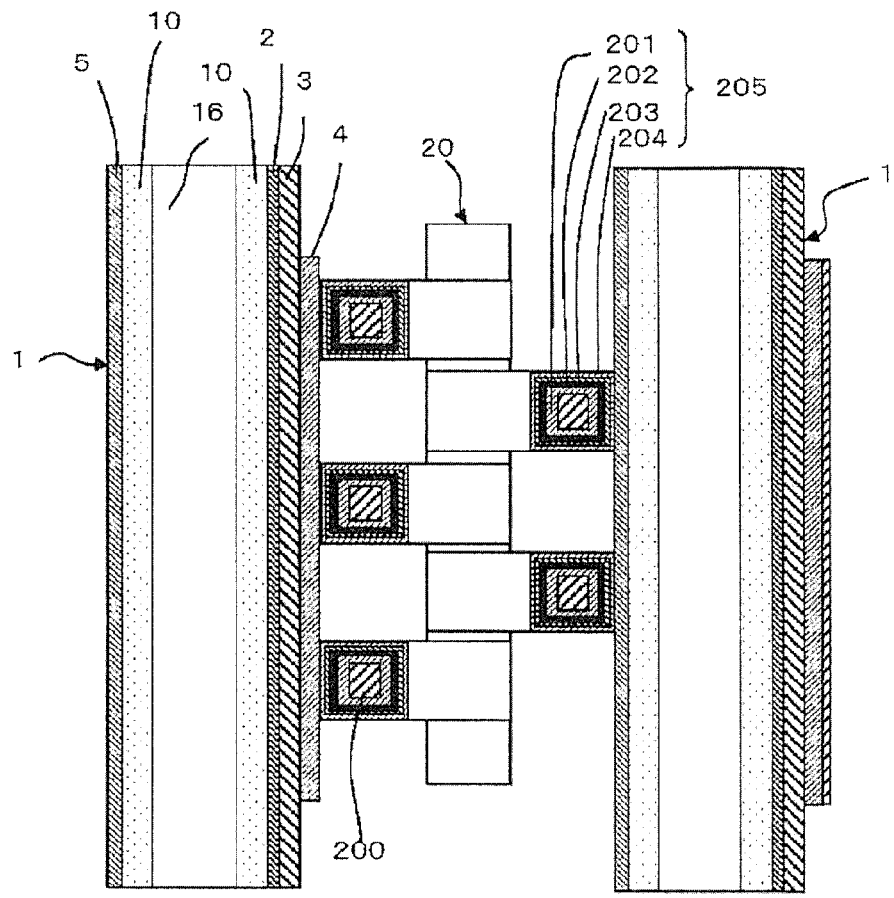
FIG. 4 is a partially-enlarged longitudinal cross-sectional view of the fuel battery cell device.

As illustrated in FIGS. 3(B) and 4, in the fuel battery cell device 30, the collector members 20 and the fuel battery cells 1 are joined to electrically connect the plural fuel battery cells 1 in series. The surface of the coating layer 205 in each of the collector members 20 is a junction surface joined to the fuel battery cell 1.

As illustrated in FIG. 4, the fuel battery cell 1 and the collector member 20 may be bonded to each other with a conductive adhesive (not shown). As a result, the contact therebetween is an ohmic contact and the potential drop is reduced, thereby effectively preventing the decrease in electricity-collecting performance.

The fuel battery cell 1 may have a configuration in which the support is also used as the fuel electrode layer 2, the solid electrolyte layer 3 and the oxygen electrode layer 4 are sequentially stacked on one surface thereof, and the interconnector 5 is stacked on the other surface thereof. Each member constituting the fuel battery cell 1 can generally be formed of known materials.

The end collector member 24 may have the same configuration as the collector member 20 or may have a configuration different from the collector member 20. The end collector member 24 is formed of the above-described composite body.

In the conductive member 32 illustrated in FIG. 3, a current drawing portion 33 for drawing out current generated by the power generation of the cell stack 31 is provided in a shape extending to the outside along the arrangement direction of the fuel battery cells 1. The conductive member 32 can be formed of the above-described composite body similarly to the collector member 20. Therefore, it is possible to reduce the Cr diffusion.

In this manner, by forming the collector member 20, the end collector member 24, and the conductive member 32 with the above-described composite body, it is possible to reduce the Cr diffusion. As a result, it is possible to reduce the diffusion of Cr into the oxygen electrode layer 4 of the fuel battery cell 1 or the interface between the oxygen electrode layer 4 and the solid electrolyte layer 3 and to reduce Cr poisoning in which the power generation performance of the fuel battery cell 1 is deteriorated.

Since a layer having high electrical resistance is not present in the coating layer 205 unlike in the related art, current collecting performance of the collector member 20 can be improved. By forming the first layer 201 containing Cr on the surface of the substrate 200 containing Cr, and forming the second layer 202 containing Cr on the surface of the first layer 201 containing Cr, the joining strength between the substrate 200 and the first layer 201, and the joining strength between the first layer 201 and the second layer 202 can be improved. The cracking in the second layer 202 or the peeling of the second layer 202 from the substrate 200 can be reduced, and the reduction of Cr diffusion can be reduced.

Further, in order to enhance the workability and the heat resistance and to reduce an influence on the fuel battery cells 1 and the adhesive material, the gas tank 34 is formed of the above-described composite body. Therefore, it is possible to reduce the Cr diffusion.

Here, the inside of the housing of the fuel battery cell device 30 is in an oxidation atmosphere by supplying oxygen-containing gas (such as air) to the inside of the housing. Cr contained in the substrate 200 is oxidized in the oxidation atmosphere and volatilization of Cr vapor (so-called Cr volatilization) may occur on the outer surface of the gas tank 34 when the fuel battery device operates at high temperatures.

Then, when Cr is volatilized in the fuel battery cells 1, the volatilized Cr reaches the oxygen electrode layer 4 or the interface between the oxygen electrode layer 4 and the solid electrolyte layer 3, and the electrical resistance may increase, which may deteriorate the power generation performance of the fuel battery cells 1.

By forming the gas tank 34 using the composite body in which the coating layer 205 is disposed on the outer surface of the substrate 200 containing Cr, it is possible to reduce the Cr diffusion. The gas tank 34 is formed of the composite body in which the coating layer 205 is disposed so as to cover the outer surface of the substrate 200 containing Cr.

In the above-described example, the fuel gas as reactant gas flows in the gas tank 34 and the oxygen-containing gas flows to the outside of the fuel battery cells 1. However, each fuel battery cell 1 may have a configuration in which the oxygen electrode layer 4, the solid electrolyte layer 3, and the fuel electrode layer 2 are sequentially stacked on one flat surface of the support 10, the oxygen-containing gas flows in the gas tank 34, and the fuel gas flows to the outside of the fuel battery cell 1. In this case, since the surface of the gas tank 34 exposed to the oxidation atmosphere is the inner surface of the gas tank 34, the above-described coating layer 205 is disposed on the inner surface of the gas tank 34.

The outer surface of the gas tank 34 means the surface facing the outside of the gas tank 34, and the inner surface of the gas tank 34 means the surface facing the inside of the gas tank.

Since a solid oxide fuel battery cell generates power under a high temperature condition of about 600° C. to 900° C., the temperature in the housing is very high. Therefore, for example, a housing body, a reformer housed in the housing, and the like are formed of a substrate containing Cr in consideration of heat resistance in some cases. In this case, each member may be formed of the above-described composite body. Therefore, it is possible to reduce the Cr poisoning of a fuel battery cell.

Figure 5:
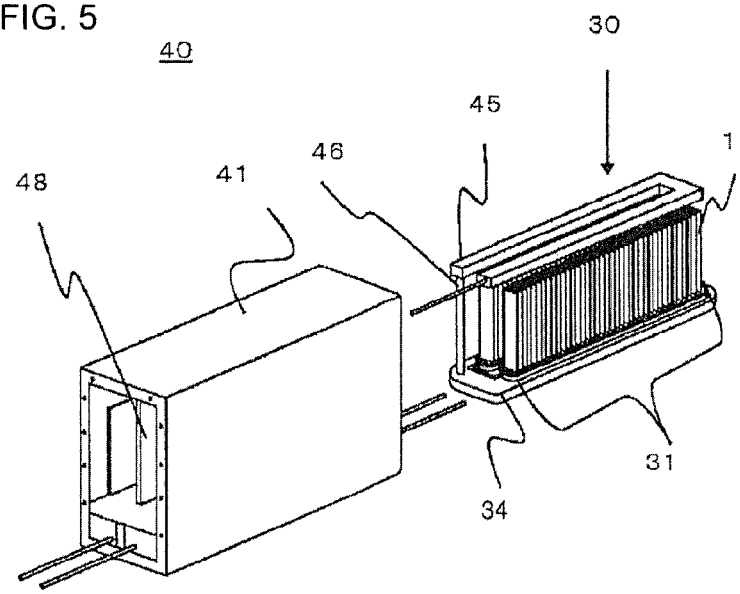
FIG. 5 is a perspective view illustrating the appearance of a fuel battery device including the fuel battery cell device illustrated in FIG. 3 and a housing.

FIG. 5 is a perspective view illustrating the appearance of a fuel battery device 40 housing the fuel battery cell device 30 which is an example of the embodiment.

In FIG. 5, the fuel battery device 40 is configured by housing the fuel battery cell device 30 in a rectangular housing 41.

In FIG. 5, in order to obtain fuel gas to be used in the fuel battery cells 1, a reformer 45 for reforming a raw material such as natural gas or kerosene to generate fuel gas is arranged above the cell stack 31. The fuel gas generated by the reformer 45 is supplied to the gas tank 34 via a gas flow pipe 46 and is supplied to the fuel gas flow channels 16 in the fuel battery cells 1 via the gas tank 34.

FIG. 5 illustrates a state in which parts (front and rear walls) of the housing 41 are removed and the fuel battery cell device 30 and the reformer 45 housed therein are pulled out backward. Here, in the fuel battery device 40 illustrated in FIG. 5, the fuel battery cell device 30 can be made to slide and can be housed in the housing 41. The fuel battery cell device 30 may include the reformer 45.

In FIG. 5, an oxygen-containing gas introducing member 48 in the housing 41 is arranged between the cell stacks 31 arranged side by side on the gas tank 34 and supplies oxygen-containing gas (air) to the lower ends of the fuel battery cells 1 so that the oxygen-containing gas flows to the side of the fuel battery cells 1 from the lower ends to the upper ends in synchronization with the flow of the fuel gas. By combusting the fuel gas discharged from the gas flow channels 16 of the fuel battery cells 1 and the oxygen-containing gas at the upper ends of the fuel battery cells 1, it is possible to increase the temperature of the fuel battery cells 1 and to accelerate the startup of the fuel battery cell device 30. By combusting the fuel gas discharged from the gas flow channels 16 of the fuel battery cells 1 at the upper ends of the fuel battery cells 1 in a longitudinal direction L thereof, it is possible to warm the reformer 45 above the fuel battery cells 1 (the cell stack 31). Therefore, the reformer 45 can efficiently perform a reforming reaction.

Figure 6:
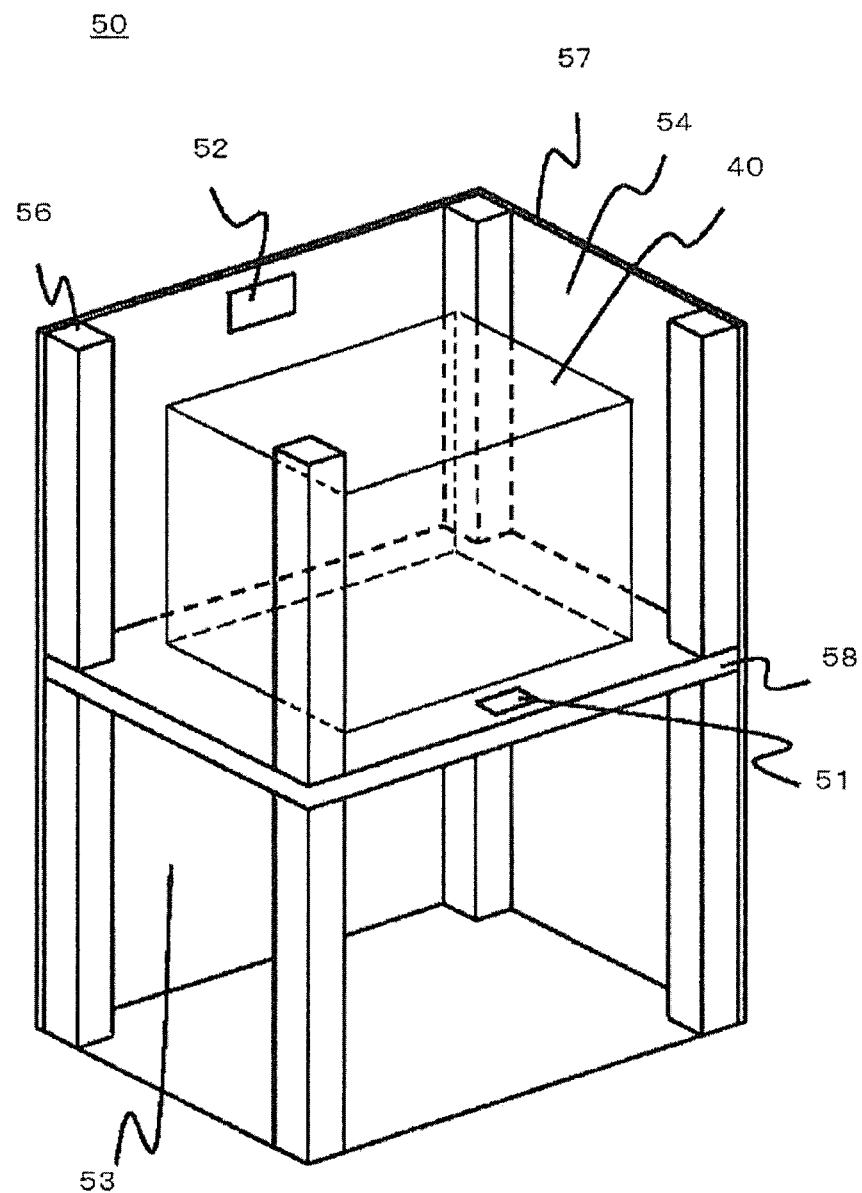
FIG. 6 is an exploded perspective view illustrating a fuel battery system in which the fuel battery device illustrated in FIG. 5 is housed in an exterior case.

FIG. 6 is an exploded perspective view illustrating a fuel battery system 50 in which the fuel battery device 40 illustrated in FIG. 5 is housed in an exterior case. Some parts are not illustrated in FIG. 6.

In the fuel battery system 50 illustrated in FIG. 6, an exterior case including columns 56 and exterior plates 57 is partitioned vertically by a partition plate 58, the upper portion is set as a fuel battery device housing chamber 54 housing the fuel battery device 40, and the lower portion is set as an auxiliary machine housing chamber 53 housing auxiliary machines used to operate the fuel battery device 40. The auxiliary machines housed in the auxiliary machine housing chamber 53 are not illustrated.

In the partition plate 58, an air flow port 51 allowing air in the auxiliary machine housing chamber 53 to flow into the fuel battery device housing chamber 54 is formed and an exhaust port 52 exhausting air in the fuel battery device housing chamber 54 is formed in a part of an exterior plate 57 constituting the fuel battery device housing chamber 54.

In such a fuel battery system 50, since the fuel battery device 40 which can improve long-term reliability is housed in the fuel battery device housing chamber 54 as described above, it is possible to provide a fuel battery system with improved long-term reliability.

While the invention has been described in detail, the invention is not limited to the above-mentioned embodiment but may be modified and improved in various forms without departing from the gist of the invention.

For example, the composite body according to the invention is not limited to the solid oxide fuel battery, but can be used for each of various members such as the housing used under high temperature conditions. For example, the composite body can be effectively used for another fuel battery such as a molten carbonate fuel battery which generates power at a temperature of 600° C. to 700° C. and each of various members such as the housing.

In the embodiment, the composite body is used for a fuel battery, but can be used for members exposed to a high temperature oxygen-containing atmosphere other than the fuel battery. For example, the composite body can be used for a member constituting a channel discharging exhaust gas generated from a vehicle engine.

EXAMPLES $Cr_2O_3$ powder and a binder were mixed and the mixture was fired at a temperature of 1050° C. for 2 hours under the atmosphere to prepare a sputtering target for the first layer 201.

Next, ZnO powder, $Cr_2O_3$ powder, and $Al_2O_3$ powder were blended at a mole ratio of 2:1:1, and the blended powder and a binder were mixed and fired at a temperature of 1050° C. for 2 hours under the atmosphere to prepare a Zn—Cr—Al-based spinel sintered body. Then, a sputtering target for a layer of the second layer 202 close to the substrate 200 was prepared.

ZnO powder and $Al_2O_3$ powder were blended at a mole ratio of 1:1, and the blended powder and a binder were mixed and fired at a temperature of 1050° C. for 2 hours under the atmosphere to prepare a Zn—Al-based spinel sintered body. Then, a sputtering target for a layer of the second layer 202 close to the third layer was prepared.

ZnO powder and $Mn_2O_3$ powder were blended at a mole ratio of 1:1, and the blended powder and a binder were mixed and fired at a temperature of 1050° C. for 2 hours under the atmosphere to prepare a Zn—Mn-based spinel sintered body. Then, a sputtering target for the third layer 203 was prepared.

ZnO powder and a binder were mixed and fired at a temperature of 1050° C. for 2 hours under the atmosphere to prepare a ZnO sintered body. Then, a sputtering target for the fourth layer 204 was prepared.

Thereafter, the respective layers of the first layer 201, a layer of the second layer 202 close to the substrate 200, a layer of the second layer 202 close to the third layer 203, the third layer 203 and the fourth layer 204 were sequentially prepared by sputtering on a substrate formed of a Fe—Cr-based heat resistant alloy plate (containing 75 mass % of Fe, and Cr, Mn, and Ni as the balance) having a thickness of 0.4 mm, a length of 20 mm, and a width of 20 mm using a sputtering method to prepare the coating layer 205 in which the thicknesses of the first layer 201, the second layer 202, the third layer 204, and the fourth layer are as shown in Table 1.

The prepared first layer 201 was formed of a chromium oxide crystal and a spinel type crystal that is a composite oxide of Cr and Mn, the second layer 202 was formed of a Zn—Al—Cr-based spinel type crystal or a Zn—Al-based spinel type crystal, the third layer 203 was formed of a Zn—Mn-based spinel type crystal, and the fourth layer 204 was mainly formed of a zinc oxide crystal.

As samples in PTL 1, Sample no. 7 in which the first layer is formed of a Zn—Cr—Mn-based spinel, and Sample No. 8 in which the first layer is not formed were prepared. Sample No. 7 was prepared by sequentially forming targets of the Zn—Cr—Mn-based spinel, a Zn—Al-based spinel, and a Zn—Mn-based spinel by a sputtering method. Sample No. 8 was prepared by sequentially forming targets of a Zn—Al-based spinel and a Zn—Mn-based spinel by a sputtering method.

The composite body having the coating layer disposed thereon was immersed in a slurry obtained by adding (La,Sr)(Co,Fe)$O_3$ powder with an average particle diameter of 0.5 μm, an acryl-based binder, and a glycol-based solvent to have a conductive adhesive ((La,Sr)(Co,Fe)$O_3$ layer) with a thickness of 15 μm on the surface of the coating layer and the resultant was baked at 1000° C.

Each sample was exposed to a 20% water vapor-containing atmosphere at 850° C. for 100 hours, and then, a Pt mesh was bonded onto the conductive adhesive on both sides of the composite body with Ag—Pd paste. A Pt line was drawn from the Pt mesh and electrical resistance was measured by a resistance measuring device at 700° C. under the atmosphere. The results are shown in Table 1.

Whether or not the peeling of or cracking in the coating layer occurred was checked by observing the surface of each sample using a scanning electron microscope (SEM) and the results are shown in Table 1.

The cross-section of the conductive adhesive of each sample was checked using an electron probe X-ray micro analyzer (EPMA). In the analysis using the EPMA, JXA-8530F made by JEOL Ltd. was used and an applied voltage of 15 kV, a probe current of $2.0 \times 10^{-7}$ A, and an analysis area of 50 μm×50 μm were set as the measurement conditions. The dispersive crystal was set to LIF. The content of Cr was measured at a position 10 m away from the interface between the coating layer and the conductive adhesive toward the conductive adhesive and the results are shown in Table 1.

The conductive adhesive ((La,Sr)(Co,Fe)$O_3$ layer) easily reacts with Cr to form a reaction product. Thus, when Cr diffuses into the conductive adhesive, a reaction product of the conductive adhesive and Cr is formed. Accordingly, the diffusion of Cr can be checked by calculating the content of Cr (mass %) in the cross-section of the conductive adhesive.

TABLE 1

| Sample No. | First layer | Thickness (μm) | Second layer | Thickness (μm) | Third layer | Thickness (μm) | Fourth layer | Thickness (μm) | Cracking or peeling of coating layer | Insulation resistance (Ω) | Cr content in conductive adhesive (mass %) |
|---|---|---|---|---|---|---|---|---|---|---|---|
| 1 | Chromium oxide | 0.5 | Zn—Al—Cr-based spinel | 0.05 | Zn—Mn-based spinel | 1 | Zinc Oxide | 2 | Not occured | 0.031 | 0 |
| 2 | Chromium oxide | 1.5 | Zn—Al—Cr-based spinel | 0.05 | Zn—Mn-based spinel | 1 | Zinc Oxide | 2 | Not occured | 0.052 | 0 |
| 3 | Chromium oxide | 3 | Zn—Al—Cr-based spinel | 0.05 | Zn—Mn-based spinel | 1 | Zinc Oxide | 2 | Not occured | 0.083 | 0 |
| 4 | Chromium oxide | 2 | Zn—Al—Cr-based spinel | 0.005 | Zn—Mn-based spinel | 1 | Zinc Oxide | 2 | Not occured | 0.044 | 1 |
| 5 | Chromium oxide | 2 | Zn—Al—Cr-based spinel | 0.02 | Zn—Mn-based spinel | 1 | Zinc Oxide | 2 | Not occured | 0.05 | 1 |
| 6 | Chromium oxide | 2 | Zn—Al—Cr-based spinel | 0.1 | Zn—Mn-based spinel | 1 | Zinc Oxide | 2 | Not occured | 0.083 | 0 |
| 7 | Zn—Cr—Mn-based spinel | 2 | Zn—Al-based spinel | 0.05 | Zn—Mn-based spinel | 3 | — | — | Not occured | 0.16 | 1 |
| 8 | — | — | Zn—Al-based spinel | 0.05 | Zn—Mn-based spinel | 3 | — | — | Occured | 0.11 | 5 |

As seen from the results of Table 1, in Sample No. 7 in which the Zn—Cr—Mn-based spinel was formed on the surface of the substrate and the Zn—Al-based spinel was formed on the surface of the layer, the electrical resistance of the Zn—Cr—Mn-based spinel layer was large and the electrical resistance of the sample was large. On the other hand, in Sample No. 8 in which the Zn—Al-based spinel was formed on the surface of the substrate, cracking or peeling was observed at a part of the coating layer and thus, the content of Cr in the conductive adhesive was 5 mass %, and the electrical resistance was large.

Contrarily, in Sample Nos. 1 to 6 of the present invention, the content of Cr in the conductive adhesive was 1 mass % or less, and the cracking or peeling of the coating layer did not occur. The electrical resistance was 0.083 S or smaller and the conductivity was good.

REFERENCE SIGNS LIST

1: Fuel battery cell
20: Collector member

200: Substrate
201: First layer
202: Second layer
203: Third layer
204: Fourth layer
205: Coating layer
30: Fuel battery cell device
31: Cell stack
34: Gas tank
40: Fuel battery device
50: Fuel battery system

The invention claimed is:

1. A composite body comprising:
a substrate containing Cr; and
a coating layer covering at least a part of the substrate,
wherein the coating layer includes
   a first layer containing Cr among constituent elements excluding oxygen, and including a chromium oxide crystal,
   a second layer disposed on the first layer, containing Zn, Al, and Cr among the constituent elements excluding oxygen, and including a spinel type crystal,
   a third layer disposed on the second layer, containing Zn and Mn among the constituent elements excluding oxygen, and including a spinel type crystal, and
   a fourth layer disposed on the third layer, containing Zn among the constituent elements excluding oxygen, and including a zinc oxide crystal.

2. The composite body according to claim 1, wherein the second layer includes, close to the third layer, a region containing Zn and Al among the constituent elements excluding oxygen, and including a spinel type crystal in which Cr is not substantially present.

3. The composite body according to claim 1, wherein the thickness of the second layer is 0.005 µm to 0.1 µm.

4. A collector member which electrically connects a plurality of fuel battery cells to each other, the collector member comprising the composite body according to claim 1.

5. A fuel battery cell device comprising:
the collector member according to claim 4; and
a plurality of fuel battery cells,
wherein the collector member is arranged between the plurality of fuel battery cells and electrically connects neighboring fuel battery cells to each other.

6. A fuel battery device comprising:
the fuel battery cell device according to claim 5; and
a housing,
wherein the fuel battery cell is housed in the housing.

* * * * *